United States Patent
Araki et al.

(10) Patent No.: US 6,704,919 B2
(45) Date of Patent: Mar. 9, 2004

(54) PRINTED CIRCUIT BOARD WIRING STRUCTURE CHECKUP SYSTEM

(75) Inventors: Kenji Araki, Saitama (JP); Ayao Yokoyama, Nagano (JP)

(73) Assignee: Sony Corporation, Tokyo (JP)

( * ) Notice: Subject to any disclaimer, the term of this patent is extended or adjusted under 35 U.S.C. 154(b) by 161 days.

(21) Appl. No.: 09/891,738

(22) Filed: Jun. 26, 2001

(65) Prior Publication Data

US 2002/0017907 A1 Feb. 14, 2002

(30) Foreign Application Priority Data

Jun. 29, 2000 (JP) .................................. P2000-196790

(51) Int. Cl.[7] .............................................. G06F 17/50
(52) U.S. Cl. ................................ 716/15; 703/4; 703/14
(58) Field of Search .............................. 716/2, 10, 15, 716/8–16; 703/14, 18, 4; 333/12, 32

(56) References Cited

U.S. PATENT DOCUMENTS 5,566,083 A * 10/1996 Fang .............................. 703/4
6,195,613 B1 * 2/2001 Roy et al. ..................... 702/65
6,532,439 B2 * 3/2003 Anderson et al. ............. 703/14

OTHER PUBLICATIONS

Lee et al. "Modeling and Analysis of Multichip Module Power Supply Planes," IEE Transactions on Components, Packaging, an Manufacturing Tech.–Part B, vol. 18, No. 4, pp. 628–639, Nov. 1995.*

Bandyopadhyay et al., "Importance of Damping and Resonance in Thin–Film Integrated Decoupling Capacitor Design," 6th Topical Meeting on Electrical Performance of Electrical Packaging, Oct. 1997, pp. 31–34.*

O'Sullivan et al., "Developing a Decoupling Methodology with SPICE for Multilayer Printed Circuit Boards," Proceedings of the 1998 International Symposium on Electromagnetic Compatibility, Aug. 1998, pp. 652–655.*

Fang et al., "Effects of Losses in Power and Ground Planes in the Simulation of Simultaneous Switching Noise," Proceedings o the 3rd Topical Meeting on Electrical Performance of Electronic Packaging, 1994 pp. 110–112.*

* cited by examiner

*Primary Examiner*—Vuthe Siek
*Assistant Examiner*—Naum B Levin
(74) *Attorney, Agent, or Firm*—Robert J. Depke; Holland & Knight LLP

(57) ABSTRACT

The check system comprises the steps of: computing the optimum position and the optimum capacitance value of the bulk capacitor on a wiring printed circuit board mounting an IC which is an object of checkup, using simple mathematical expressions; determining if an actual capacitance value and an actual position of the bulk capacitor tentatively designed are nearly equal to the optimum value and optimum position computed; determining if the tentatively designed capacitance value of the bulk capacitor exceeds a value of a total sum of capacitance values of decoupling capacitors multiplied by a predetermined constant; and if the optimum conditions are not satisfied, displaying appropriate instructions to modify the tentative design value and position of the bulk capacitor to coincide with the optimum value and position.

7 Claims, 12 Drawing Sheets

PRINTED CIRCUIT BOARD WIRING STRUCTURE CHECKUP SYSTEM

RELATED APPLICATION DATA

This application claims priority to Japanese Patent Application JP 2000-196790, and the disclosure of that application is incorporated herein by reference to the extent permitted by law.

BACKGROUND OF THE INVENTION

1. Field of the Invention

The present invention relates to a printed circuit board wiring structure checkup system, and in particular, it relates to a printed circuit board wiring structure checkup system including a layout method (design method) of a bulk capacitor which is to be disposed in the periphery of a high speed IC.

2. Related Art

Generally, a bulk capacitor for use as a circuit element on a printed circuit board in a recent electronic device is used for supplying a constant dc power and current to the device when all signal pins therein are switched at the same time under a maximum capacity load.

It is also known that it functions at the same time to supply a charge to a decoupling capacitor which is used in conjunction with the bulk capacitor.

A value of capacitance of the above-mentioned bulk capacitor is known to need to have an appropriate capacitance value capable of supplying a dc power (current) over a predetermined value when all the signal pins are switched at the same time, and also capable of supplying an adequate charge to all decoupling capacitors to be served by the bulk capacitor.

Further, it is also known that in order to be able to supply an adequate charge quickly to a power dropout portion or the decoupling capacitor, a position of the bulk capacitor must be in the vicinity of an IC and the decoupling capacitor which are the objects to supply the charge.

However, it is seldom that actual values of capacitance and actual positions of bulk capacitors now in use are specified precisely in a strict sense. For example, as to the capacitance, in most cases, it is designated by manufacturers who supply ICs or circuits regarding a preferred positioning, the number to be disposed and a capacitance value of the bulk capacitors, or they are determined on the basis of a result of testing by actually positioning bulk capacitors on a test board.

Also, it is often practiced that the position of the bulk capacitor, the number of arrangement thereof and circuit constants thereof are imported from the past experiences of operation. Further, also as to the position of arrangement of the bulk capacitor, it is often defined ambiguously such as "position as near as possible to a target IC".

By the way, in line with an increasingly high speed signal in ICs and an increasing number of pins, a quantity of current or a pass-through current flowing from a power supply to the ground, and/or a frequency thereof are increasing remarkably.

In addition, because of an increasing number of power supply pins or ground pins there is such a problem that it is difficult to know which bulk capacitor is effective to which pin, or which bulk capacitor is responsible for supplying a charge to which decoupling capacitor.

Further, because it is anticipated that a quantity of current flowing into a power plane and/or a frequency thereof will change with an increasing speed of its digital signals, there arises such a problem when actually determining its circuit constants, the number of its provision and the position of the bulk capacitors, that it is difficult quantitatively to determine how many bulk capacitors with how much capacitance are where to be positioned.

Still further, there was such a problem that a supply of electric charge to a corresponding decoupling capacitor from its host bulk capacitor was not sufficient thereby delaying an effective response of the decoupling capacitor so as to increase a radiation noise resulting from a bounce noise (a noise which occurs when a potential of a power source plane or a ground plane varies locally).

SUMMARY OF THE INVENTION

The present invention is contemplated to solve the above-mentioned problems associated with the conventional printed circuit board design and checkup system, and to provide a novel printed circuit board wiring structure checkup system which is capable of verifying if a capacitance value of a bulk capacitor corresponding to power pins, ground pins and decoupling capacitors in an object circuit is adequate, and/or if its position in the circuit is optimal.

The novel printed circuit board wiring structure checkup system in accordance with one embodiment of the invention contemplated to solve the above-mentioned problems associated with the prior art is directed to a printed circuit board wiring structure checkup system capable of checking if a tentative wiring structure temporarily designed on a printed circuit board is acceptable or not. The check up system is comprised of: an object extract unit for extracting part numbers of all ICs from a list of parts listing all parts existing on its wiring and sorted into groups, extracting a characteristic specification of each of the ICs, and selecting a high speed IC as an object of checkup on the basis of "a rise time" or "a fall time" of a peripheral pulse current of each IC which is contained in the characteristic specification; a sorting unit for sorting all part numbers of all parts connected to a power line of the wiring structure including the high speed IC selected into groups of power pins, bulk capacitors and decoupling capacitors, for each of high speed ICs extracted above; an optimum capacitance value computing unit for computing an optimum capacitance value the bulk capacitor should have; a plurality of comparison units for comparing, for example, a capacitance value of a tentative design value given to the bulk capacitor and the optimum capacitance value computed; a first countermeasure display unit for displaying a first countermeasure instruction when a difference larger than a predetermined value is found between items of comparison in any one of the plurality of comparison units; an optimum positioning compute unit for computing an optimum position to dispose the bulk capacitor; and a second countermeasure display unit for displaying a second countermeasure instruction when a difference larger than a predetermined value is found in comparison of the tentative design position of the bulk capacitor with the optimum position thereof computed above.

Namely, there are provided such advantages according to one embodiment of the present invention that an optimum position to place the bulk capacitor, which is an object of checkup, on a printed circuit board and an optimum capacitance value thereof are calculated using simple mathematical expressions, that it is verified whether or not the design value of the bulk capacitor is in the vicinity of the optimum value computed and/or whether or not the bulk capacitor is placed in the vicinity of the optimum position computed, and that if the actual position and actual capacitance value of the bulk capacitor differ largely from the optimum position and optimum value calculated above, an appropriate message is displayed instructing to change the position and the capacitance value of the bulk capacitor to become optimal. Thereby, according to the invention, it is enabled to define a corresponding relation of each bulk capacitor with a respective power pin (or ground pin) and a respective decoupling capacitor for which the bulk capacitor is responsible in a grand integrated circuit including grand networks of several hundreds thereof and power supplies, and also to determine the optimum capacitance value and the optimum position for these bulk capacitors without the needs of replacing the conventional design procedures and increasing the design cost.

Still further, there is another advantage such that the bounce noise which is considered to arise in the periphery of the power pin described above can be suppressed substantially.

In accordance with another embodiment of present invention, there is provided an apparatus for checking a wiring structure designed for a printed circuit board. The apparatus may comprise: an object extract unit for selecting a high speed IC to be checked; a sorting unit for classifying parts connected to a power wiring of said high speed IC into groups of power pins, bulk capacitors and decoupling capacitors; a capacitance value computing unit for computing an target capacitance value for said bulk capacitor; a first comparison unit for comparing a capacitance value tentatively given to said bulk capacitance with said target capacitance value; and a first countermeasure display unit for displaying a first countermeasure instruction if there arises a difference larger than a predetermined value between said tentative design value and said target value computed.

Alternatively, the apparatus may comprise an object extract unit for selecting a high speed IC to be checked; a sorting unit for classifying parts connected to a power wiring of said high speed IC into groups of power pins, bulk capacitors and decoupling capacitors; a position computing unit for computing a target position for said bulk capacitor to be placed; a second comparison unit for comparing a tentative design position of said bulk capacitor with said target position thereof computed, and a second countermeasure display unit for displaying a second countermeasure instruction if there arises a difference larger than a predetermined value between said tentative design position and said target position computed.

In accordance with still another embodiment of the present invention, there is provided a method for checking a wiring structure designed for a printed circuit board. The method may comprise the steps of: selecting a high speed IC to be checked; classifying parts connected to a power wiring of said high speed IC into groups of power pins, bulk capacitors and decoupling capacitors; computing an target capacitance value for said bulk capacitor; comparing a capacitance value tentatively given to said bulk capacitance with said target capacitance value; and displaying a first countermeasure instruction if there arises a difference larger than a predetermined value between said tentative design value and said target value computed.

Alternatively, the method may comprise the steps of: selecting a high speed IC to be checked; classifying parts connected to a power wiring of said high speed IC into groups of power pins, bulk capacitors and decoupling capacitors; computing a target position for said bulk capacitor to be placed; comparing a tentative design position of said bulk capacitor with said target position thereof computed, and displaying a second countermeasure instruction if there arises a difference larger than a predetermined value between said tentative design position and said target position computed.

BRIEF DESCRIPTION OF THE DRAWINGS

The foregoing and other objects and features of the invention will become apparent from the following description of preferred embodiments of the invention with reference to the accompanying drawings, in which.

PREFERRED EMBODIMENT OF THE INVENTION

Preferred embodiments of the invention will be described with reference to the accompanying drawings in the following.

Figure 1:
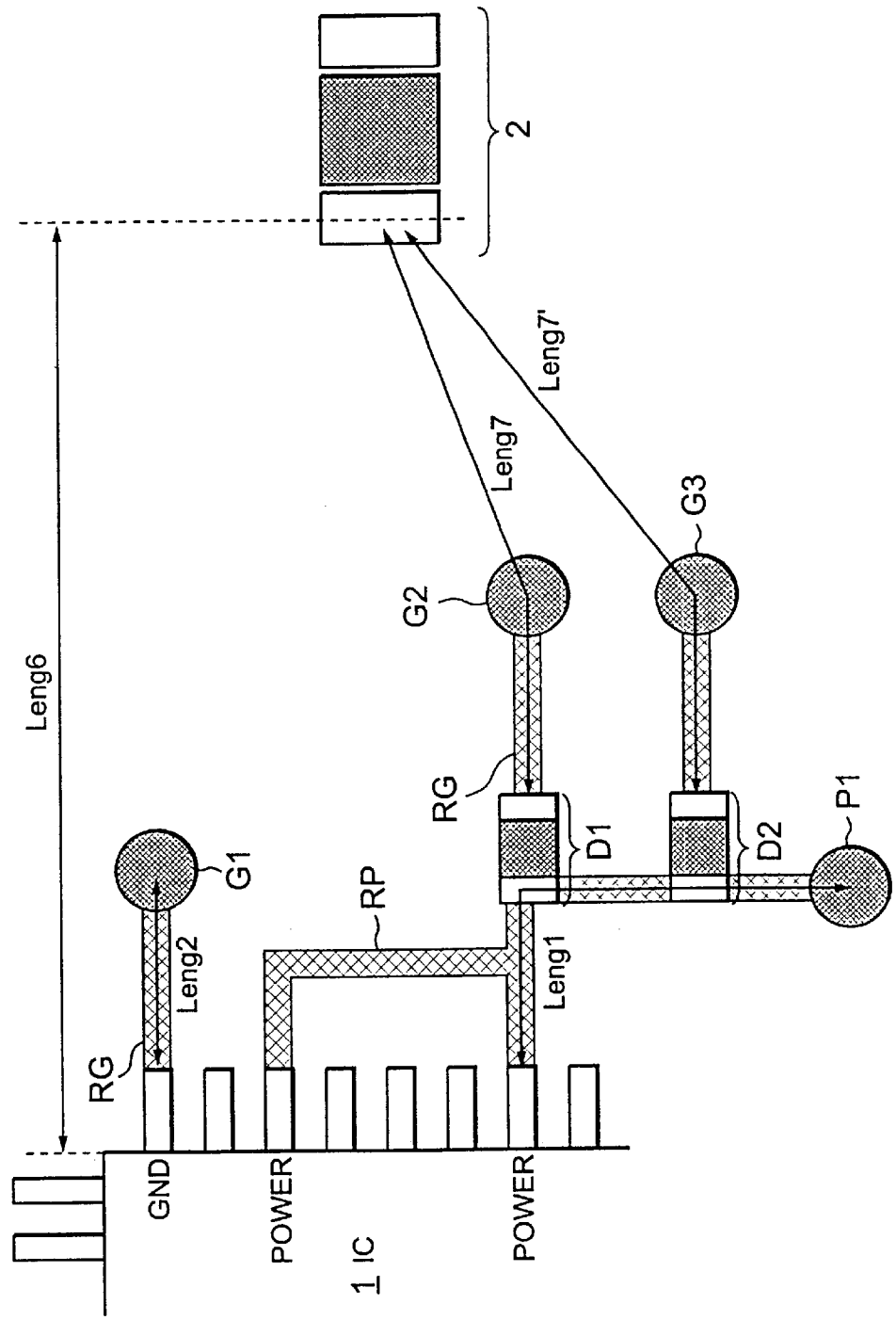
FIG. 1 is a schematic wiring diagram illustrating a relationship between a power source plane and a wiring on a wiring board which is an object of checkup by a printed circuit board wiring structure checkup system embodying the invention.

FIG. 1 is a schematic wiring diagram indicating a circuit wiring on a wiring board which is an object of checkup by the printed circuit board wiring structure check system according to a preferred embodiment of the invention.

The wiring diagram shown in FIG. 1 includes: an IC (Integrated Circuit) 1; a bulk capacitor 2 for supplying a constant dc power and current to devices and also supplying an electric charge to decoupling capacitors (to be described later); decoupling capacitors D1, D2; via holes G1, G2, G3 to a GND (ground) solid layer; a via hole P1 to a power solid layer; a GND wiring RG, and a power line RP.

Here, a symbol "Leng1" denotes a wiring distance of a power line RP extending from a power terminal (pin) provided in a bottom of an IC 1 until a via hole P1 leading to the power solid plane (layer). A symbol "Leng2" denotes a wiring distance of the GND wiring RG extending from a GND pin of the IC 1 to a via hole G1 leading to the GND solid plane. A symbol "Leng6" denotes a shortest distance from a pin connection portion of the IC 1 to a bulk capacitor 2. A symbol "Leng7" denotes a distance between a decoupling capacitor D1 and the bulk capacitor 2 along a GND wiring RG. A symbol "Leng7'" denotes a distance between a decoupling capacitor D2 and the bulk capacitor 2 along a GND wiring RG.

Figure 2:
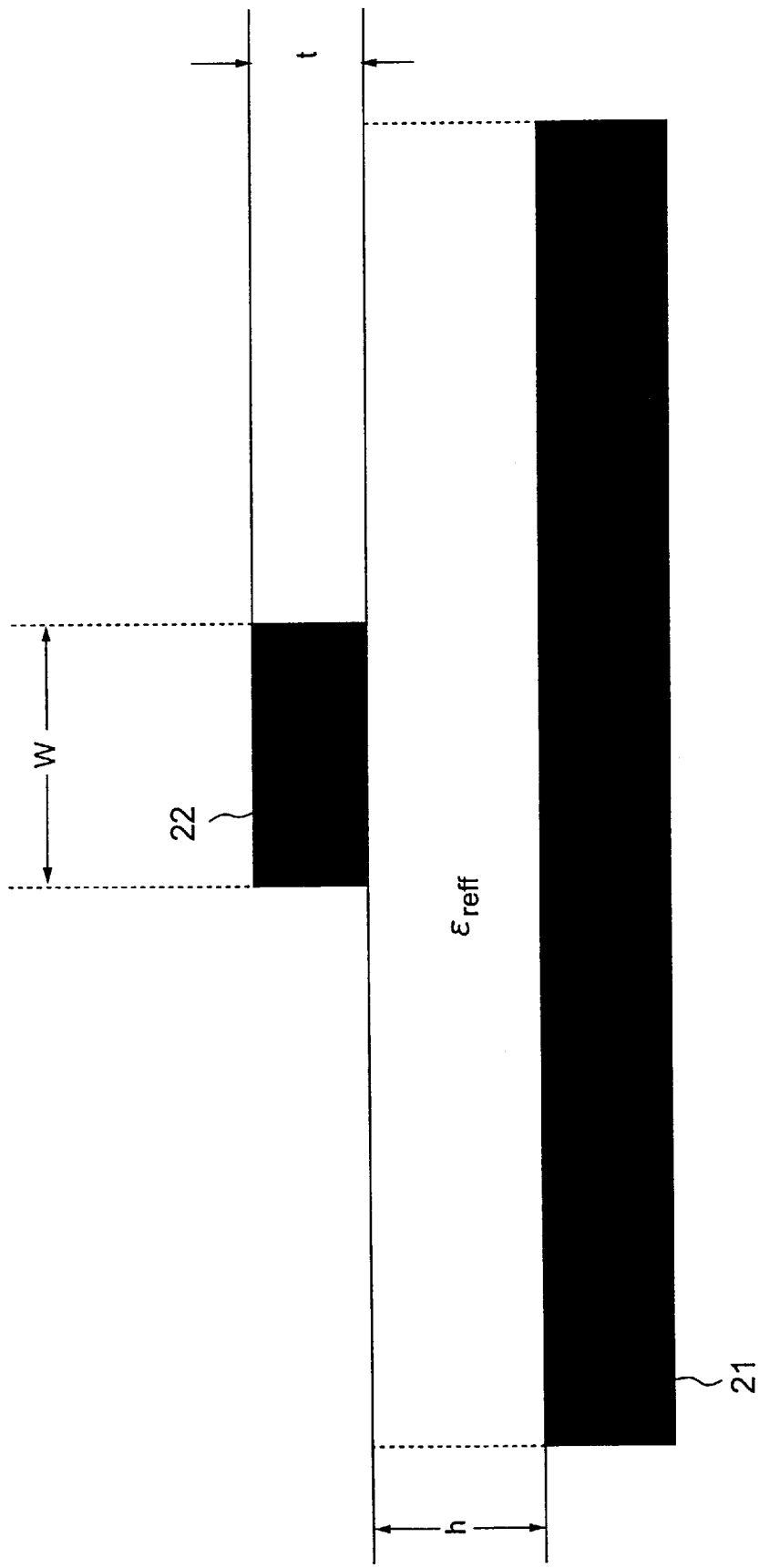
FIG. 2 is a wiring diagram illustrating a wiring structure referred to as a micro strip line which is an object of checkup by the printed circuit board wiring structure checkup system embodying the invention.

FIG. 2 shows a schematic diagram of a wiring structure which is an object of checkup by the printed circuit board wiring structure checkup system according to the preferred embodiment of the invention.

Figure 3:
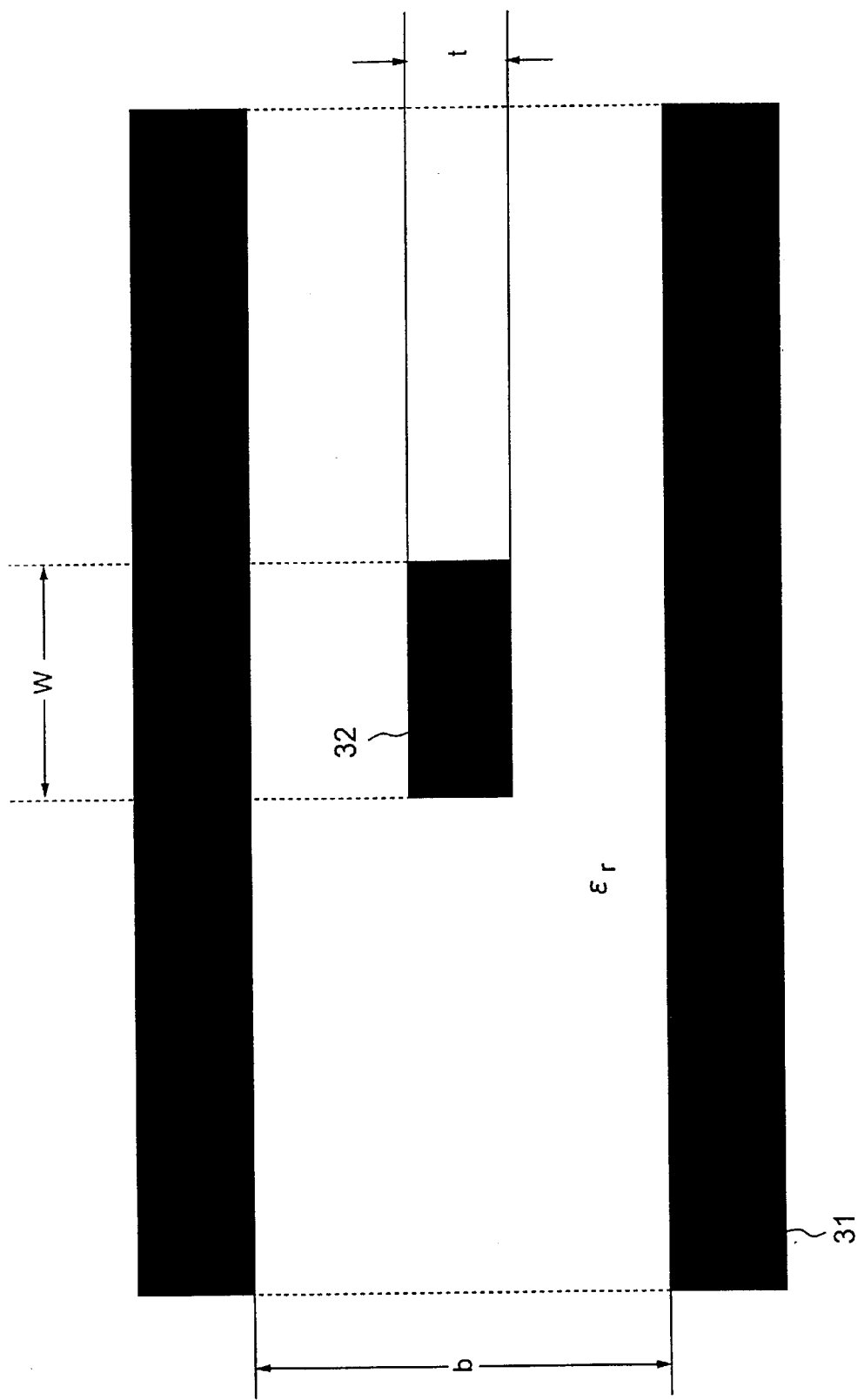
FIG. 3 is a wiring diagram illustrating a wiring structure referred to as a single strip line which is an object of checkup by the printed circuit board wiring structure checkup system embodying the invention.
Figure 4:
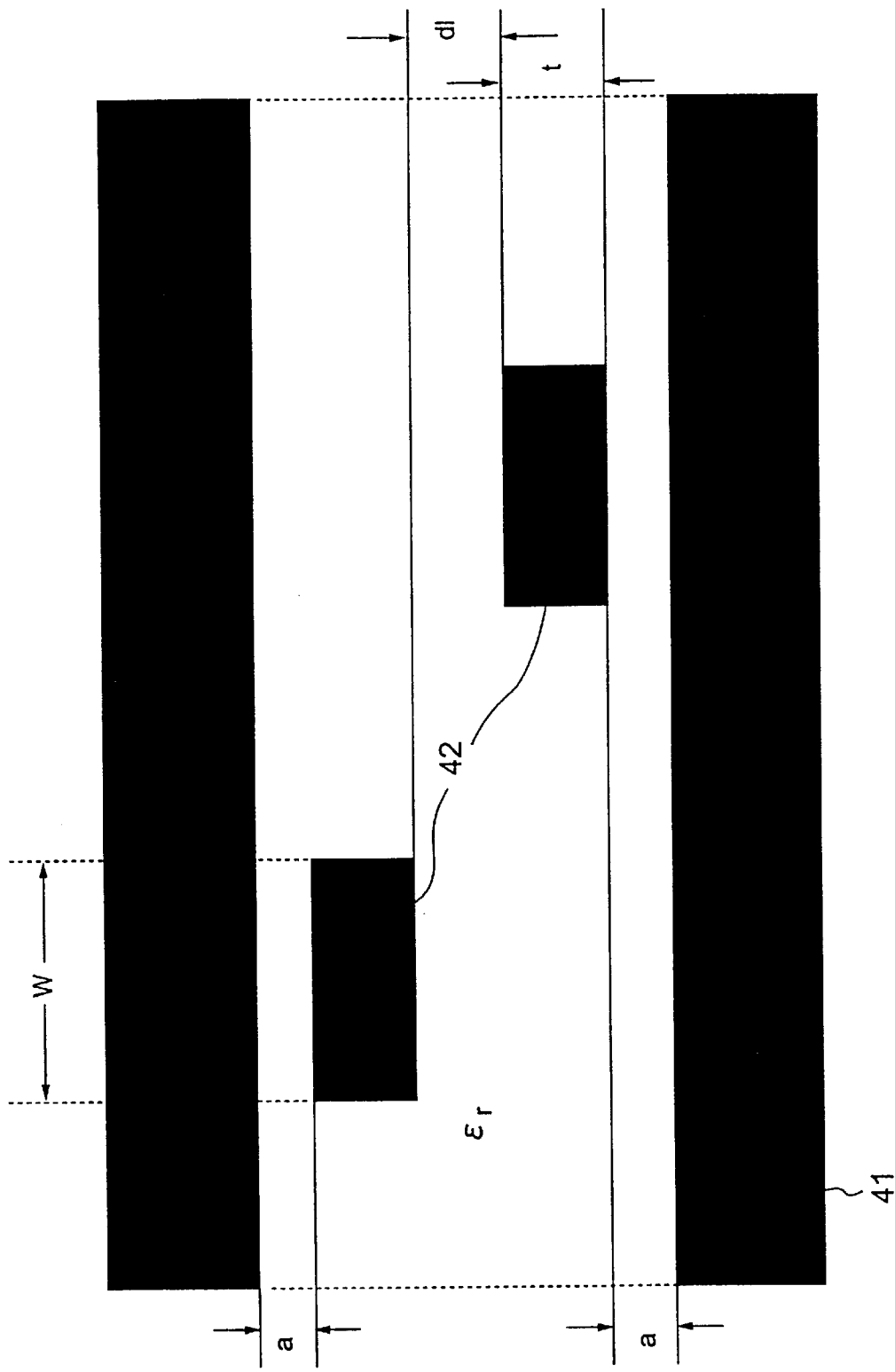
FIG. 4 is a wiring diagram illustrating a wiring structure referred to as a double strip line which is an object of checkup by the printed circuit board wiring structure checkup system embodying the invention.

FIGS. 3 and 4 show schematic diagrams of other wiring structures which are objects of checkup by the printed circuit board wiring structure checkup system.

Although in the following description of the preferred embodiment of the invention, the wiring structure of FIG. 2 referred to as the micro strip line is used, it is not limited thereto, and the wiring structure checkup system of the invention can be applied to checkup of the wiring structure of a so-called single strip line structure shown in FIG. 3 as well as to the checkup of the wiring structure of a so-called double strip line structure shown in FIG. 4.

The wiring structure shown in FIG. 2 includes a power solid plane (plane layer) 21 and a wiring 22 provided on the power solid plane 21. The wiring structure shown in FIG. 3 includes power solid planes 31 and a wiring 32 interposed between these power solid planes. The wiring structure shown in FIG. 4 includes power solid planes 41 and two systems of wiring 42 interposed between these power solid planes 41.

Further, in the wiring structures shown in FIGS. 2 through 4, a length indicated by a symbol "w" denotes a width of wiring ($\mu$m); a length indicated by a symbol "t" denotes a thickness of wiring; a length indicated by a symbol "h" denotes a distance ($\mu$m) between the wiring and the plane layer in the micro strip line structure; a length indicated by a symbol "b" denotes a distance ($\mu$m) between the two plane layers 31, 31 in the single strip line structure; a length indicated by a symbol "a" denotes a distance ($\mu$m) between a wiring and the plane layer which is nearest in a perpendicular direction to this wiring in the double strip line structure; a length indicated by a symbol "d1" denotes a line distance ($\mu$m) between the two systems of wiring in the double strip line structure; a symbol "$\epsilon_r$" denotes a dielectric constant between the two power solid planes 31 in the single strip line structure, and also between the two power solid planes 41 in the double strip line structure; a symbol "$\epsilon_{reff}$" denotes an effective dielectric constant between the power solid plane 21 and the wiring 22 in the micro strip line structure.

A function of the printed circuit board wiring structure checkup system according to the present embodiment will now be described in the following. However, a configuration of the printed circuit board wiring structure checkup system in accordance with one embodiment of the invention will be omitted of its illustration because a conventional computer system comprising a CPU, a memory and a man-machine interface unit may be applicable.

In the printed circuit board wiring structure checkup system according to the present embodiment, a checkup and verification of a wiring structure which is tentatively designed on a printed circuit board is carried out by a method comprising the steps of: computing an optimum position of a bulk capacitor to be placed in a circuit tentatively designed on the printed circuit board which is an object of checkup, and also an optimum capacitance value thereof, using simple mathematical expressions (to be described later); on the basis of a result of the above computation, determining whether or not the bulk capacitor tentatively designed has a capacitance value near to the optimum value, and is placed near to the optimum position; if its actual position and actual value differ from its optimal position and optimum value, instructing to modify its actual position and actual value to coincide with the optimum position and the optimum value and/or displaying an appropriate error message.

Thereby, it is enabled according to the invention to significantly suppress the bounce noise occurring in the power plane or the ground plane, and/or the radiation noise occurring due to the bounce noise.

Figure 5:
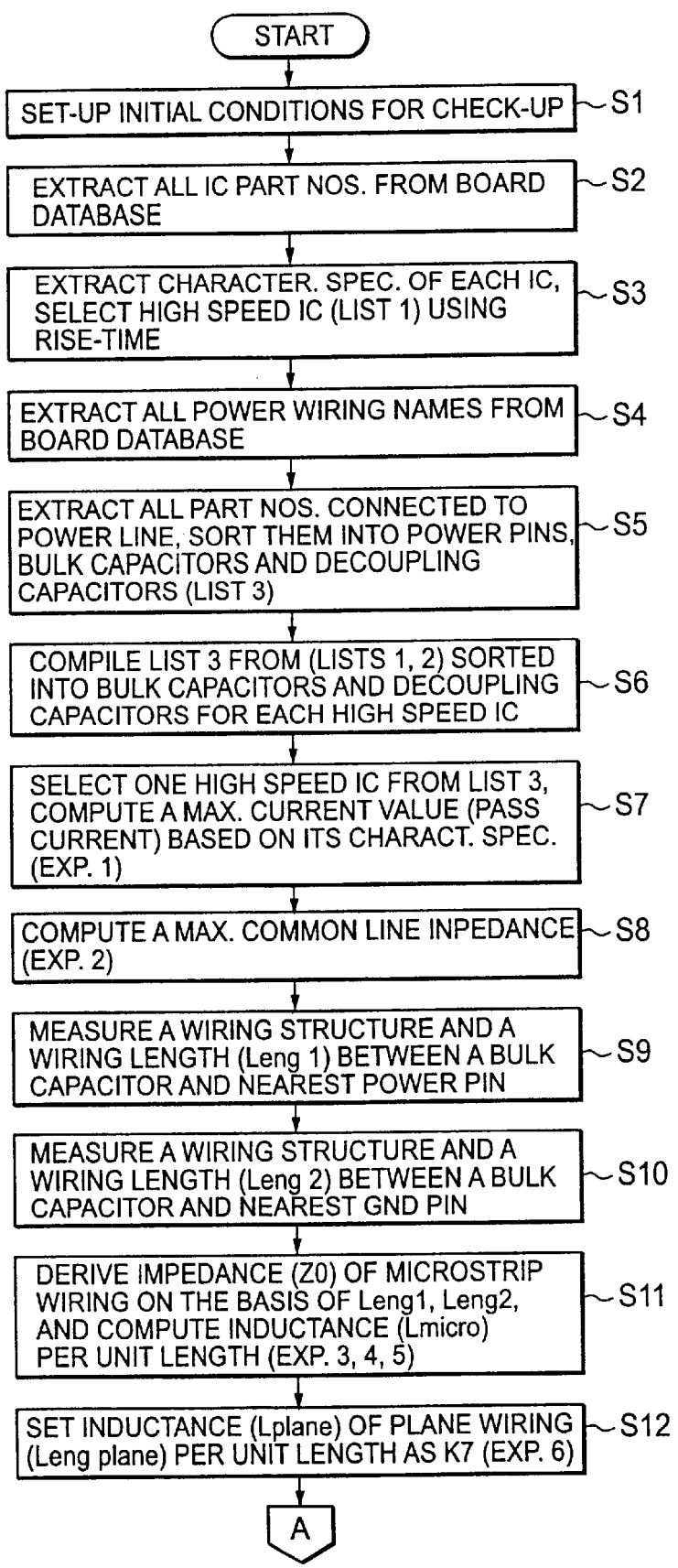
FIG. 5 is a part (⅓) of a flowchart indicating operational steps of the wiring structure check system as a printed circuit board wiring design support method embodying the invention.
Figure 6:
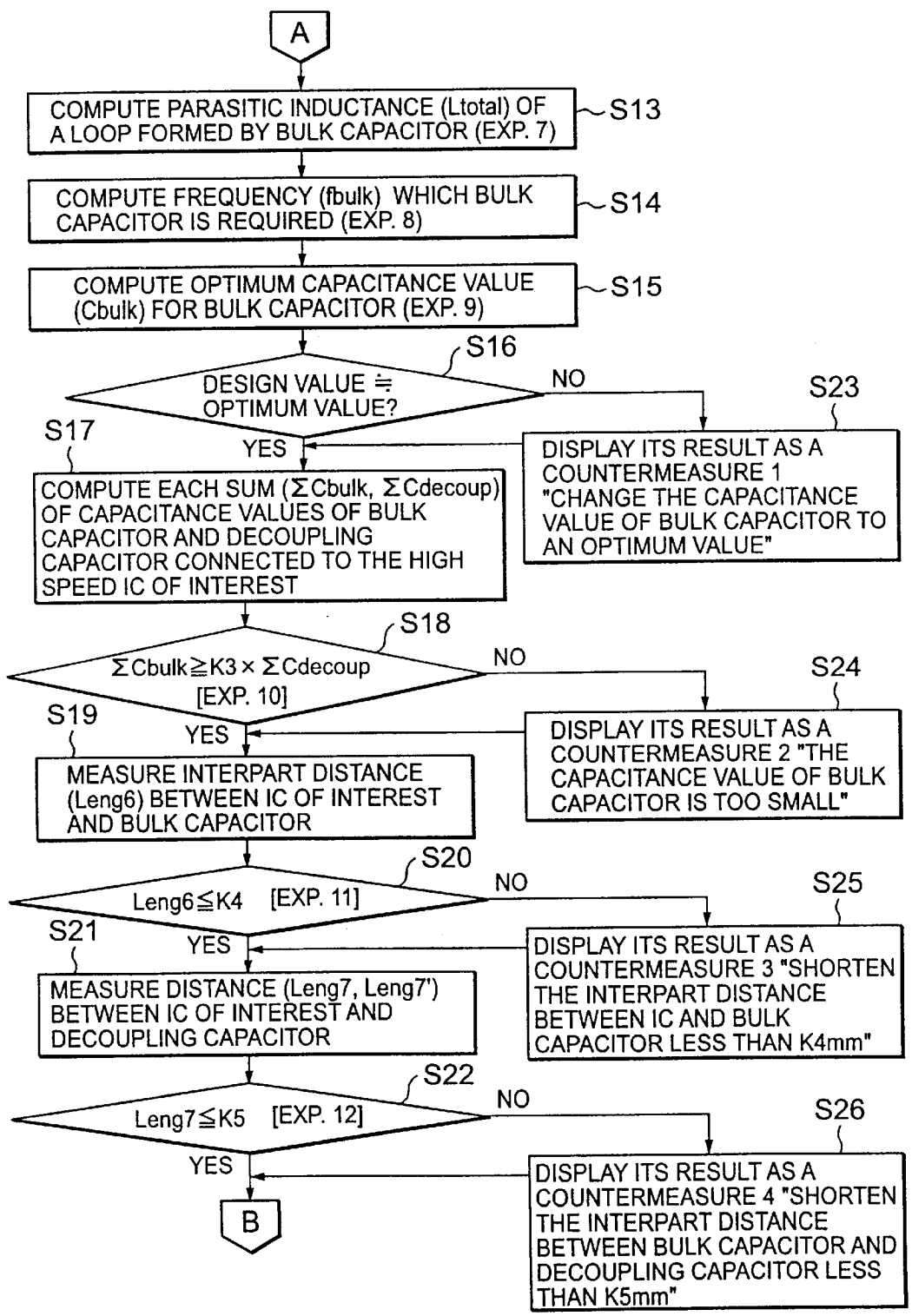
FIG. 6 is a flowchart indicating another part (⅔) of the operational steps of the wiring structure check system as the printed circuit board wiring design support method embodying the invention.
Figure 7:
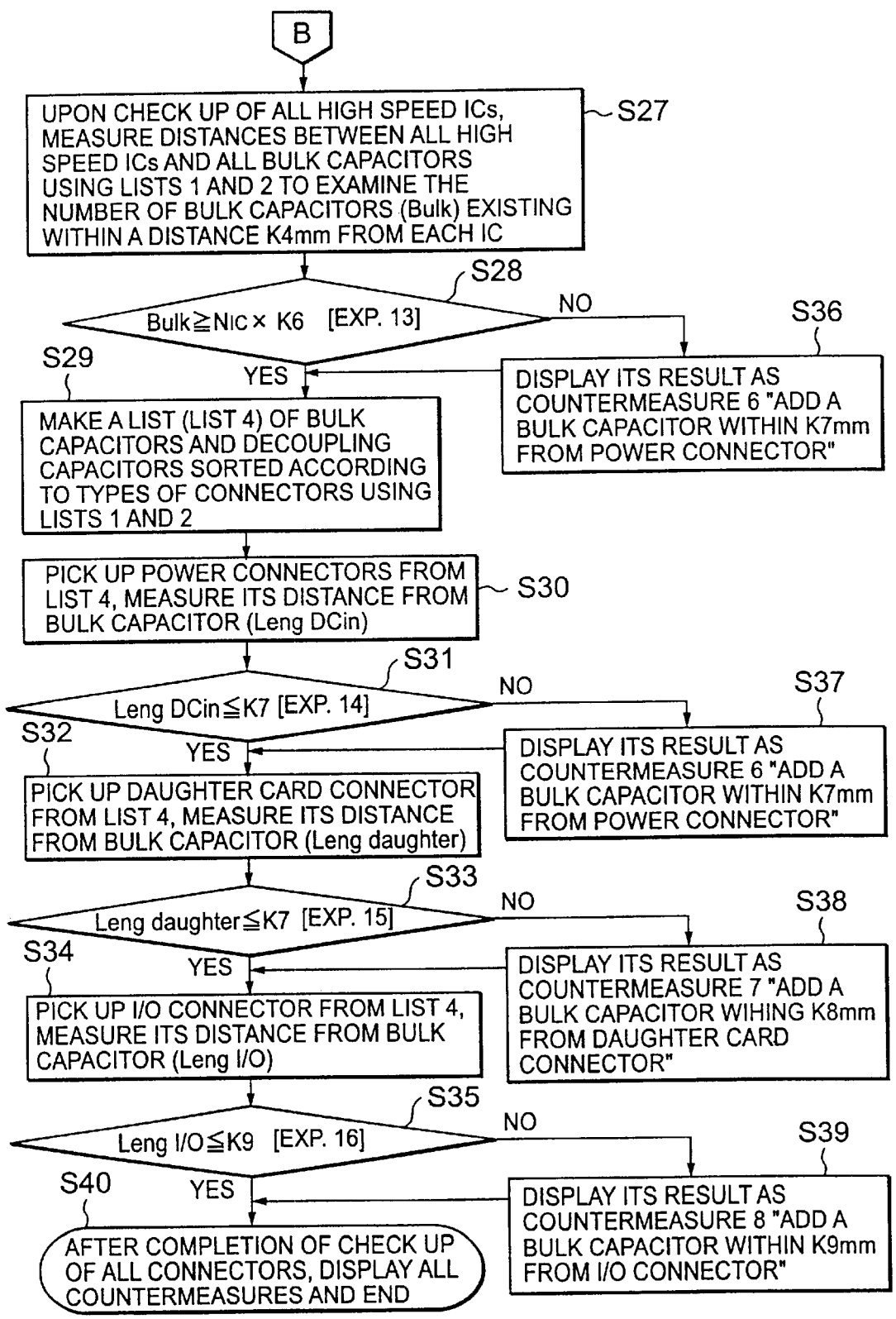
FIG. 7 is a flowchart indicating still another part (3/3) of the operational steps of the wiring structure check system as the printed circuit board wiring design support method embodying the invention.

FIGS. 5 through 7 are flowcharts indicating respective parts (⅓ to ⅔) of operational steps in the printed circuit board wiring structure check system of the invention functioning as a wiring design support system.

With reference to FIGS. 1 to 4, and using the flowcharts in FIGS. 5 to 7, a system function embodying the invention will be described in the following.

In the following description, it is assumed that a symbol "$\Delta I$" is a maximum current (A) anticipated in the periphery of an IC, a symbol "N" is the number of gates of CMOS gates in the IC, a symbol "$C_{load}$" is an input capacitance (F) of the CMOS gates in the IC, a symbol "dV" is an amplitude (V) of the CMOS gates in the IC, a symbol "dt" is a rise time (s) of a pulse current anticipated in the periphery of the IC, a symbol "Z" is a maximum allowable common line impedance ($\Omega$), a symbol "$V_{noise}$" is a maximum allowable noise voltage, a symbol "$f_{bulk}$" is a frequency (Hz) at which a provision of a bulk capacitor is required, a symbol "$L_{total}$" is a parasitic impedance (H) of a loop including a nearest power pin, a nearest GND pin and a bulk capacitor, a symbol "$L_{micro}$" is a parasitic inductance (H) of the micro strip line, a symbol "$L_{plane}$" is a parasitic inductance (H) of the power plane, a symbol "$Z_0$" is a characteristic impedance ($\Omega$), a symbol "$C_0$" is a characteristic capacitance (F), a symbol "$Leng_{micro}$" is a total length of wiring (m) in the micro strip structure, a symbol "$C_{bulk}$" is a capacitance value (F) of the bulk capacitor, a symbol "$C_{decoup}$" is a capacitance value (F) of the decoupling capacitor, a symbol "Bulk" is the number of bulk capacitors which are disposed within a predetermined distance (to be described later) from the IC, a symbol "$N_{IC}$" is the number of ICs, a symbol "$Leng_{DCin}$" is a distance (m) from the power input connector portion to the bulk capacitor, a symbol "$Leng_{daughter}$" is a distance (m) from the daughter card connector to the bulk capacitor, a symbol "$Leng_{I/O}$" is a distance (m) from a power terminal on the I/O connector provided for a peripheral device and a secondary circuit to the bulk capacitor, and symbols "K1" through "K9" are predetermined coefficients. Descriptions of the other symbols and denotations same as those already described are omitted.

Mathematical expressions which will be used in the following description will be set forth listed together in the latter part of the description.

Now, with reference to FIG. 5, in a first step S1, initial conditions required for starting the checkup procedure are set up.

In step S2, part numbers of all IC parts are extracted from a board database (not shown) which stores board related information.

In step S3, a characteristic specification of a respective IC is extracted, and on the basis of a rise time thereof, a list 1 is compiled in which only high speed ICs are selected.

In step S4, all names (IDs) of power wiring are extracted from the board-related database.

In step S5, all part numbers which are connected to the power wiring are extracted to compile a list 2 in which they are sorted into groups of power pins, bulk capacitors and decoupling capacitors.

In step S6, from lists 1 and 2 described above, a list 3 is compiled in which the bulk capacitors and the decoupling capacitors are sorted according to a respective high speed IC.

In step S7, one of the high speed ICs is selected from the list 3, and its maximum current value (pass current) is calculated on the basis of its characteristic specification and using a mathematical expression (1) to be described later.

In step S8, a maximum common line impedance is calculated using a mathematical expression (2) to be described later.

In step S9, a wiring structure and a wiring length ("Leng1" in FIG. 1) between a bulk capacitor and a power pin nearest to this bulk capacitor are determined and measured.

In step S10, a wiring structure and a wiring length ("Leng2" in FIG. 1) between a bulk capacitor and a ground (GND) pin nearest to this bulk capacitor are determined and measured.

In step S11, on the basis of a result of determination of each wiring structure of "Leng1" and "Leng2", and using mathematical expressions (3), (4) and (5) to be described later, an impedance ($Z_0$) of a micro strip wiring of "$Leng_{micro}$" is derived, and an inductance "$L_{micro}$" per unit length is calculated.

In step S12, using a mathematical expression (6) to be described later, an inductance "$L_{plane}$" per unit length in a portion "$Leng_{plane}$" of a plane wiring is set up as K7 (nH/mm).

Now, with reference to FIG. 6, a second part (⅔) of the flowchart will be described.

In step S13, using a mathematical expression (7) to be described later, a parasitic inductance "$L_{total}$" of a loop formed by the bulk capacitors is computed.

In step S14, using a mathematical expression (8) to be described later, a frequency "$f_{bulk}$" at which a provision of a bulk capacitor is required is computed.

In step S15, using a mathematical expression (9) to be described later, an optimum capacitance value "$C_{bulk}$" of the bulk capacitor is computed.

In step S16, it is determined if a designed value of the bulk capacitor, namely, an actual capacitance value thereof, is nearly equal to an optimum capacitance value "$C_{bulk}$" computed above or not. If it is nearly equal, the step goes to step S17, and if not, the step advances to a step S23.

In step S17, a total sum of capacitance values of bulk capacitors and of decoupling capacitors which are connected to a high speed IC of interest is computed respectively. These total sums are expressed as "$\Sigma C_{bulk}$" and "$\Sigma C_{decoup}$", respectively.

In step S18, a mathematical expression (10) which is a conditional expression having the above-mentioned "$\Sigma C_{bulk}$" and "$\Sigma C_{decoup}$" as its parameters is evaluated. If this conditional equation is satisfied, the step goes to step S19, and if not, the step advances to step S24.

In step S19, an interconnect distance ("Leng6" in FIG. 1) between the IC of interest and a bulk capacitor corresponding thereto is measured.

In step S20, a mathematical expression (11) as a conditional equation having the above-mentioned interconnect distance "Leng6" and a constant K4 as its parameters is evaluated. If this conditional equation is satisfied, the step goes to step S21, and if not, the step advances to step S25.

In step S21, respective distances "Leng7" and "Leng7'" shown in FIG. 1 between the bulk capacitor and respective decoupling capacitors D1, D2 corresponding to the IC of interest are measured.

In step S22, a mathematical expression (12) to be described later, which is a conditional equation having the above-mentioned "Leng7", "Leng7'" and a constant K5 as its parameters is evaluated. If this conditional equation is satisfied, the step advances to step S27, and if not, the step goes to step S26.

In step S23, a result of the check in step S16, corresponding to "NO" is displayed as a countermeasure instruction (1). It is possible to include in the contents of the countermeasure instruction (1) such a message as "change the current capacitance value of the bulk capacitor to an optimum value".

In step S24, a result of the check in step S18, corresponding to "NO" is displayed as a countermeasure instruction (2). It is possible to include in the contents of the countermeasure instruction (2) such a message as "the current capacitance value of the bulk capacitor is too small".

In step S25, a result of the check in step S20, corresponding to "NO" is displayed as a countermeasure instruction (3). It is possible to include in the contents of the countermeasure instruction (3) such a message as "shorten the interconnect distance between the IC and the bulk capacitor within the range of "constant K4" mm".

In step S26, a result of the check in step S22, corresponding to "NO" is displayed as a countermeasure instruction (4). It is possible to include in the contents of the countermeasure instruction (4) such a message as "shorten the interconnect distance between the bulk capacitor and the decoupling capacitor within "constant K5 " mm".

Now, with reference to FIG. 7, the other part (⅓) of the flowchart will be described in the following.

In step S27, upon completion of checkup of all the high speed ICs, measurements of distances between all the high speed ICs and all the bulk capacitors are executed using the lists 1 and 2 described above, then the number of the bulk capacitors ("Bulk") existing within a distance of "constant K4" mm from each IC is examined to make ready for operation of a next step S28.

In step S28, it is determined if there are disposed a minimum number of bulk capacitors ("constant K6") per IC or not. More specifically, a mathematical expression (13) which is a conditional equation having the number of bulk capacitors "Bulk", the number of ICs "$N_{IC}$" and constant K6 as its parameters is evaluated. If this conditional equation is satisfied, the step goes to step S29, and if not, the step moves to a step S36 to be explained later.

In step S29, using the above-mentioned list 1 and list 2, a list 4 is compiled in which the bulk capacitors and the decoupling capacitors are sorted according to types of connectors.

In step S30, a power connector is selected from the aforementioned list 4, and a distance thereof from a bulk capacitor ("$Leng_{DCin}$") is measured.

In step S31, a mathematical expression (14) to be explained later, which is a conditional equation having the aforementioned distance "$Leng_{DCin}$" and a constant K7 as its parameters is evaluated. If this conditional equation is satisfied, the step goes to step S32, and if not, the step moves to a step S37.

In step S32, a daughter card connector is selected from the list 4, and a distance thereof from the bulk capacitor ("$Leng_{daughter}$") is measured.

In step S33, a mathematical expression (15) to be explained later, which is a conditional equation having the aforementioned "$Leng_{daughter}$" and a constant K8 as its parameters, is evaluated. If this conditional equation is satisfied, the step goes to step S34, and if not, the step moves to step S38 to be described later.

In step S34, an I/O connector is selected from the list 4, and its distance "$Leng_{I/O}$" from the bulk capacitance is measured.

In step S35, a mathematical expression (16) which is a conditional equation having the aforementioned distance "$Leng_{I/O}$" and a constant K9 as its parameters is evaluated. If this conditional equation is satisfied, the step goes to step S40, and if not, the step goes to step S39 to be described later.

In step S36, a result of the checkup in the step S28 described above is displayed as a countermeasure instruction (5). It is possible to include in the contents of the countermeasure instruction (5) such a message as "add a bulk capacitor within a range of the "constant K4" mm from the IC".

In step S37, a result of the checkup in the step S31 described above is displayed as a countermeasure instruction (6). In the contents of the countermeasure instruction (6), it is possible to include such a message as "add a bulk capacitor within a range of the "constant K7" mm from the power connector".

In step S38, a result of the checkup in the step S33 described above is displayed as a countermeasure instruction (7). In the contents of the countermeasure instruction (7), it is possible to include such a message as "add a bulk capacitor within the range of the "constant K8" mm from the daughter card connector".

In step S39, a result of the checkup in the step S35 described above is displayed as a countermeasure instruction (8). In the contents of the countermeasure instruction (8), it is possible to include such a message as "add a bulk capacitor within the range of the "constant K9" mm from the I/O connector".

After completion of checkup of all the connectors, in step S40, all the aforementioned countermeasure instructions, i.e., the instruction messages from (1) to (8) are displayed, and all the procedures are terminated.

Figure 8:
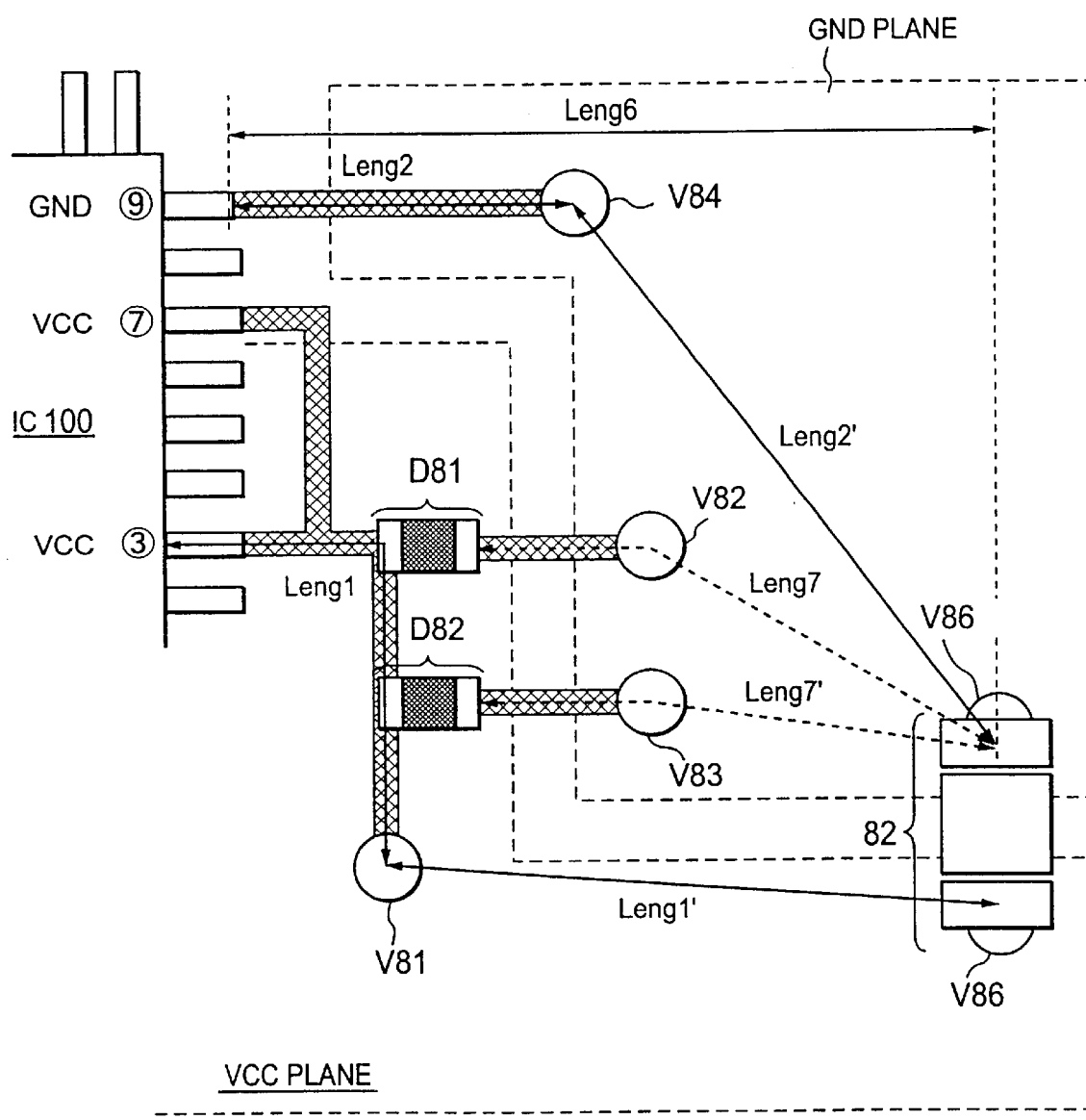
FIG. 8 is a wiring diagram showing an example of wiring on the wiring board which is an object of the checkup by the printed circuit board wiring structure checkup system embodying the invention.

FIG. 8 is a schematic wiring diagram illustrating an example of wiring on a wiring board which is an object of checkup of the printed circuit board wiring structure check system embodying the invention.

The wiring on the wiring board (on-board wiring) illustrated in FIG. 8 includes: a high speed IC 100 having VCC pins attached with circled numbers 3 and 7, and a GND pin attached with a circled number 9; a bulk capacitor 82 with a capacitance of 100 $\mu$F; a decoupling capacitor D1 with a capacitance of 1000 $\mu$F; another decoupling capacitor D2 with a capacitance of 0.1 $\mu$F; and via holes V81 through V86.

Here, a specification of the aforementioned on-board wiring is assumed to be that a total number of gates "N" of the IC is 100; an input capacitance "$C_{load}$" is 10.0 pF; the amplitude "dV" is 5.0 V; a rise time "dt" is 1.0 ns; a length indicated by the symbol "Leng1" is 40.0 mm; a length indicated by the symbol "Leng2" is 5.0 mm; a length indicated by the symbol "Leng2'" is 60.0 mm; a length indicated by the symbol "Leng6" is 60.0 mm; a length indicated by the symbol "Leng7" is 35.0 mm; and a length indicated by the symbol "Leng7'" is 30.0 mm.

Figure 9:
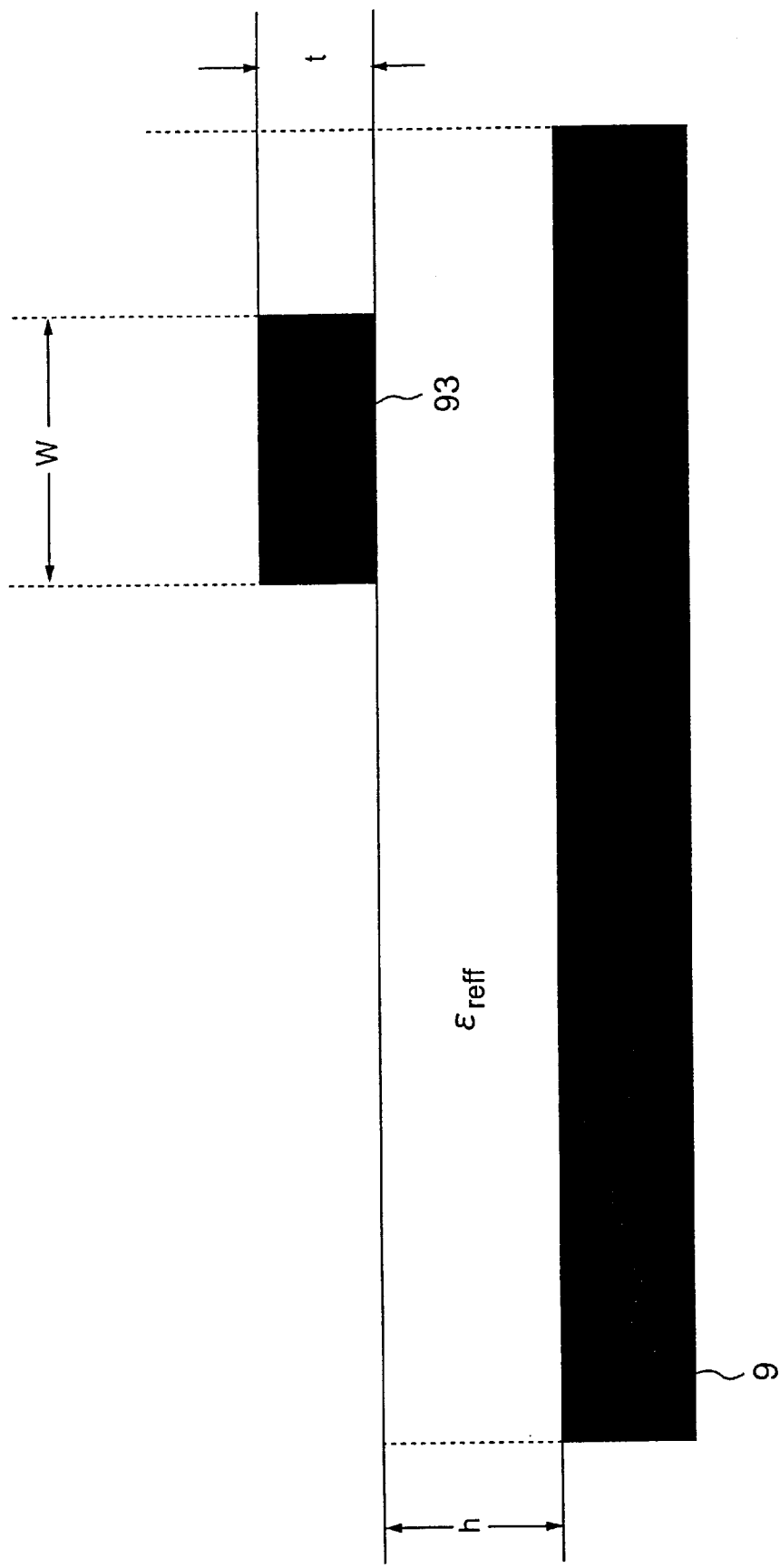
FIG. 9 is a wiring diagram showing an example of wiring structures on the wiring board which is an object of checkup by the printed circuit board wiring structure checkup system embodying the invention.

FIG. 9 is a schematic wiring diagram illustrating an example of wiring structures on a wiring board which is an object of checkup by the printed circuit board wiring structure check system embodying the invention.

A specification of the example of wiring structures on the wiring board shown in FIG. 9 is assumed to be as follows.

Namely, it is assumed that a type of this wiring structure is a micro strip line; a width of wiring "W" is 0.40 mm=400 $\mu$m; a thickness of wiring "t" is 0.04 mm=40 $\mu$m; a height of wiring "h" is 0.10 mm=100 $\mu$m; a dielectric constant "$\epsilon_r$" is 4.3; and an effective dielectric constant "$\epsilon_{reff}$" is 3.6.

Figure 10:
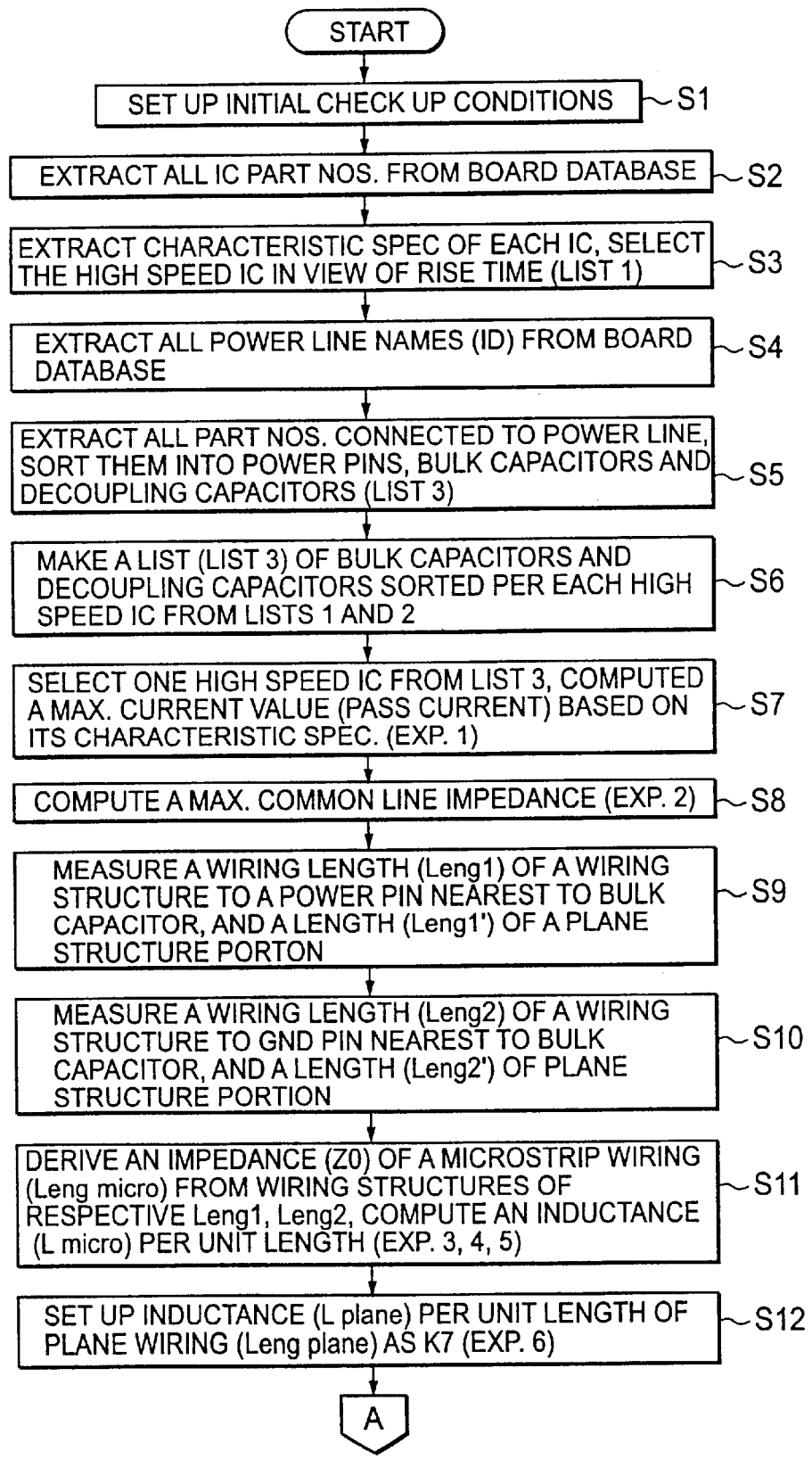
FIG. 10 is a flowchart indicating a part (⅓) of process steps of the printed circuit board wiring structure checkup system embodying the invention as applied to a checkup of a printed circuit board having the on-board wiring indicated in FIG. 8 and the wiring structure indicated in FIG. 9.
Figure 11:
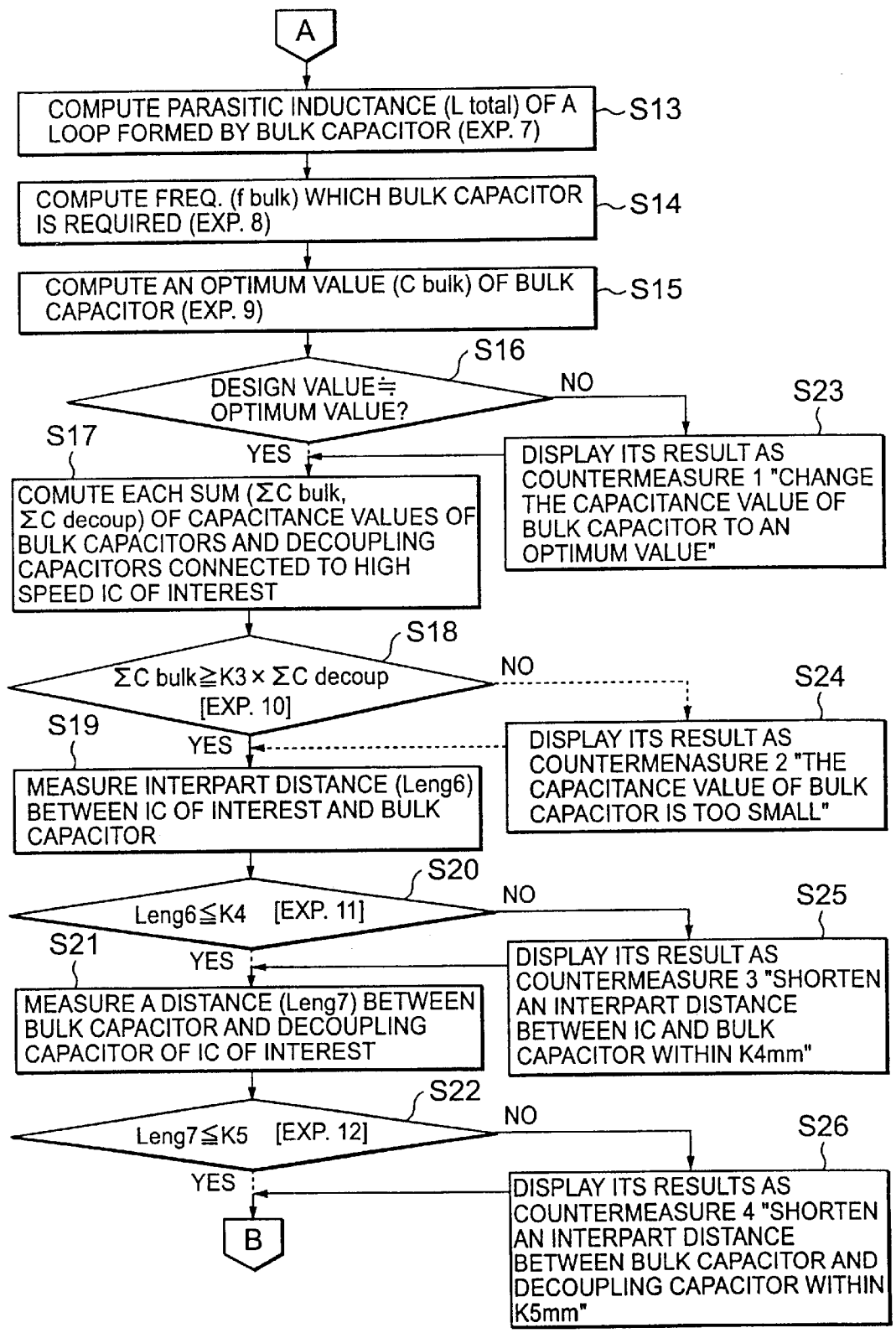
FIG. 11 is a flowchart indicating another part (⅔) of the process steps of the printed circuit board wiring structure checkup system embodying the invention as applied to the checkup of the printed circuit board having the on-board wiring indicated in FIG. 8 and the wiring structure indicated in FIG. 9.
Figure 12:
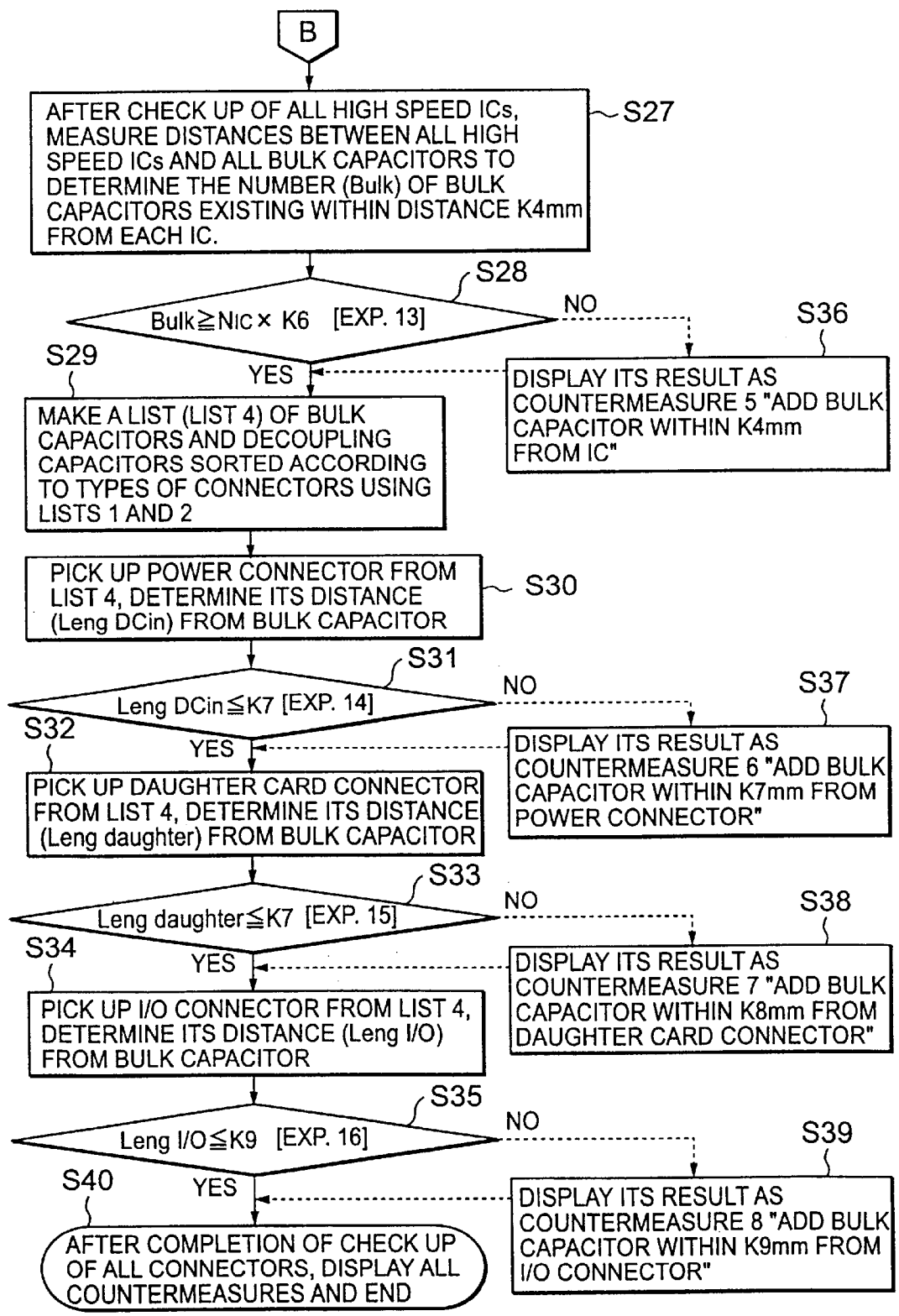
FIG. 12 is a flowchart indicating still another part (3/3) of the process steps of the printed circuit board wiring structure checkup system embodying the invention as applied to the checkup of the printed circuit board having the on-board wiring indicated in FIG. 8 and the wiring structure indicated in FIG. 9.

FIGS. 10 to 12 are flowcharts (⅓ to ⅔) indicating steps of procedures of processing executed in a checkup of a printed circuit board having the on-board wiring of FIG. 8 and the wiring structure of FIG. 9, and using the printed circuit board wiring structure check system embodying the invention.

Solid lines shown in the flowcharts of FIGS. 10 through 12 indicate actual routes of procedures actually followed in the above-mentioned process execution while broken lines indicate routes of procedures which are not actually executed in the present example.

More specifically, processes in step S1 through S16, S23, S17 through S20, S25, S21, S22, S26 through S35 and S40 are actually executed here, and other processes are not executed in the instant example.

The above-mentioned steps of processing will be described in the following along the routes actually followed.

In the following description, however, it is assumed that the constant K1 is 0.005, the constant K2 is 3, the constant K3 is 10, the constant K4 is 20, the constant K5 is 20, the constant K6 is 2, the constant K7 is 10, the constant K8 is 10, the constant K9 is 10, and the maximum noise voltage "$V_{noise}$" is 0.1.

With reference to FIG. 10, in a first step S1, initial conditions are set up as follows: K1=0.005; constant K2=3; constant K3=10; constant K4=20; constant K5=20; constant K6=2; constant K7=10; constant K8=10, constant K9=10; and a maximum noise voltage "$V_{noise}$"=0.1.

In steps S2 and S3, a list 1 is compiled in which an IC with a part number IC 100 is selected as a high speed IC.

In steps S4 and S5, a list 2 is compiled in which all parts connected to a power wiring name of VCC are sorted into respective groups consisting of power pins nos. 3 and 7 in the IC 100; the bulk capacitor 82; and the decoupling capacitors D81, D82.

In step S6, a list 3 is compiled from the lists 1 and 2 described above for each high speed IC, indicating that the high speed IC which is IC 100 here has the bulk capacitor 82 and the decoupling capacitors D81, D82 connected thereto.

In step S7, a maximum current 5.0 A is calculated for the IC 100.

In step S8, using the mathematical expression (2) and from "$V_{noise}$"=0.1 V, a maximum common line impedance is computed to be 0.02 Ω.

In step S9, a wiring length "Leng1" of a micro strip structure which occupies a wiring length between the bulk capacitor 82 and the VCC pin attached with number 3 is measured to be 40.0 mm, and a length "Leng1'" of a plane structure portion therebetween is measured to be 50.0 mm.

In step S10, a wiring length "Leng2" of a micro strip structure portion which occupies a wiring length between the bulk capacitor 82 and the GND pin attached with the number 9 is measured to be 5.0 mm, and a length "Leng2'" of a plane structure portion therebetween is measured to be 60.0 mm.

In step S11, using mathematical expressions (3), (4) and (5), it is calculated as follows. "$Leng_{micro}$"=45.0 mm, "$Z_0$"= 21.0 Ω, "L micro"=131 nH/m.

In step S12, using mathematical expression (6), it is set up that "$Leng_{plane}$"=110.0 mm, and "$L_{plane}$"=0.005 nH/mm.

In step S13, using a mathematical expression (7), it is computed that "$L_{total}$"=9.46 nH.

In step S14, using a mathematical expression (8), it is computed that "$f_{bulk}$"=337 kHz.

In step S15, using a mathematical expression (9), it is computed that "$C_{bulk}$"=23.6 μF.

In steps S16 and S23, a design value (=100.0 μF) is compared with an optimum value (=23.6 μF), and because the condition that they be early equal is not satisfied, a countermeasure instruction (1) is displayed (or set ready to display).

In step S17, it is calculated from the capacitance value of the bulk capacitor 82 that $\Sigma C_{bulk}$=100.0 μF, and from a respective capacitance value of the decoupling capacitors D81 and D82 that $\Sigma C_{decoup}$=0.101 μF.

In step S18, because its conditional equation ($\Sigma C_{bulk} \geq 10 \times \Sigma C_{decoup}$) of a mathematical expression (10) is satisfied, a countermeasure instruction (2) is not displayed here.

In step S19, a shortest interconnect distance ("Leng6") between the IC 100 and the bulk capacitor 82 is measured to be 60.0 mm.

In steps S20 and S25, because its conditional equation ("Leng6"≦20) of a mathematical expression (11) is not satisfied, a countermeasure instruction (3) is output to be displayed.

In step S21, it is measured that an interconnect distance "Leng7" between the bulk capacitor 82 and the decoupling capacitor D81 is 35.0 mm, and an interconnect distance "Leng7'" between the bulk capacitor 82 and the decoupling capacitor D82 is 30.0 mm.

In steps S22 and S26, because its conditional equation ("Leng7"≦20 AND "Leng7'"≦20) of an mathematical expression (12) is not satisfied, a countermeasure instruction (4) is displayed.

In steps S27 and S28, because no other high speed ICs (other than IC 100) exists here, no other processing is executed.

In steps S29 through S35, because no other connector exists here, no processing is executed.

In step S40, after the above-mentioned countermeasure instructions (1), (3) and (4) having been displayed, the checkup procedure is terminated.

(Description of Mathematical Expressions)

The mathematical expressions used in the above description of the flowcharts will set forth in the following.

The mathematical expression (1) relating to the step S7 is given as follows.

$$\Delta I = N \times C_{load} \times dv/dt \quad (1)$$

The mathematical expression (2) relating to the step S8 is given as follows.

$$Z = V_{noise}/\Delta I \quad (2)$$

The mathematical expressions (3), (4) and (5) relating to the step S11 are given as follows.

$$Z_0 = 87/([(\varepsilon_{reff} + 1.41) \times \ln(5.98h/(0.8w+t))])^{1/2} \quad (3)$$

$$\varepsilon_{reff} = ((\varepsilon_r + 1)/2) + (\varepsilon_r - 1)/(2(1 + 10h/w)^{1/2}) \quad (4)$$

$$L_{micro} = (\varepsilon_{reff} \times Z_0/C_0)^{1/2} \quad (5)$$

The mathematical expression (6) used in the step S12 is given as follows.

$$L_{plane} = K1 \quad (6)$$

Further, the mathematical expression (7) used in the step S13 is given as follows.

$$L_{total} = (L_{micro} \times Leng_{micro} + L_{plane} \times Leng_{plane}) + K2 \quad (7)$$

The mathematical expression (8) used in step S14 is given as follows.

$$f_{bulk} = Z/(2\pi \times L_{total}) \quad (8)$$

Further, the mathematical expression (9) used in step S15 is given as follows.

$$C_{bulk} = 1/(2\pi \times f_{bulk} \times Z) \quad (9)$$

The mathematical expression (10) used in step S18 is given as follows.

$$\Sigma C_{bulk} \pm K3 \times \Sigma C_{decoup} \quad (10)$$

The mathematical expression (11) used in step S20 is given as follows.

$$Leng6 \leq K4 \quad (11)$$

The mathematical expression (12) used in step S22 is given as follows.

$$Leng7 \leq K5 \text{ AND } Leng7' \leq K5 \quad (12)$$

The mathematical expression (13) used in step S28 is given as follows.

$$\text{Bulk} \leq N_{IC \times K6} \tag{13}$$

The mathematical expression (14) used in step S31 is given as follows.

$$\text{Leng}_{DCin} \leq K7 \tag{14}$$

The mathematical expression (15) used in step S33 is given as follows.

$$\text{Leng}_{daughter} \leq K8 \tag{15}$$

Lastly, the mathematical expression (16) used in step S35 is given as follows.

$$\text{Leng}_{I/O} \leq K9 \tag{16}$$

By way of example, the mathematical expressions or conditional expressions set forth hereinabove are used in the following meanings and intentions.

The mathematical expression (1) is used for calculating the maximum current value (pass current) when all of the IC gates are assumed to have been switched simultaneously (i.e., the worst case).

The mathematical expression (2) is used for calculating the maximum common line impedance Z allowable for the logic element (IC) used on the basis of the allowable maximum noise margin $V_{noise}$.

The mathematical expressions (3), (4) and (5) are used for calculating the inductance $L_{micro}$ per unit length for the case where its power wiring structure is the micro strip structure.

In the case where its power wiring is the power plane or the ground plane, the mathematical expression (6) is used for calculating the inductance $L_{plane}$ per unit length thereof.

The mathematical expression (7) is used for calculating the parasitic inductance $L_{total}$ in the loop comprising the nearest power pin, the nearest GND pin and the bulk capacitor. It should be noted, however, that the length of the loop comprising the nearest power pin, the nearest GND pin and the bulk capacitor is calculated with a linear distance.

The mathematical expression (8) is used for obtaining the frequency $f_{bulk}$ at which the bulk capacitor is required.

The mathematical expression (9) is used for determining the capacitance value $C_{bulk}$ of the bulk capacitor.

The mathematical expression (10) is used for determining if the capacitance value $C_{bulk}$ of the bulk capacitor is greater than a value of the capacitance value $C_{decoup}$ of the decoupling capacitor multiplied by the constant K3.

The mathematical expression (11) is used for determining if the distance of the bulk capacitor is shorter than the constant K4 mm from the IC of interest.

The mathematical expression (12) is used for determining if the distance between the bulk capacitor and the decoupling capacitor is shorter than the constant K5 mm. However, as shown in FIG. 1, as for the distances of "Leng6" and "Leng7", a distance between its via hole portion for the ground layer and the bulk capacitor is calculated with a linear distance.

The mathematical expressing (13) is used for determining if bulk capacitors at least in a number of K6 per IC are disposed.

The mathematical expression (14) is used for verifying if a bulk capacitor is disposed in the vicinity of the power input connector portion of the printed circuit board from a power supply.

The mathematical expression (15) is used for verifying if a bulk capacitor is disposed in the vicinity of the daughter card connector.

The mathematical expression (16) is used for verifying if a bulk capacitor is disposed in the vicinity of the power terminal on the I/O connector for a peripheral device and the secondary circuit.

By way of example, a computer program for executing the procedures shown in the flowcharts FIGS. 5 through 7 and others, namely, the program for executing the processing by the printed circuit board wiring structure check system embodying the invention, may be supplied as stored in a computer readable recording medium such as a CD-ROM, a magnetic tape or the like. Then, a computer including in its category a microcomputer, a personal computer and a general purpose computer may be used to read out and execute the above-mentioned program from the recording medium.

According to the embodiments as described hereinabove, it has been accomplished advantageously without the needs of changing the conventional design process and increasing the design cost but only using the simple mathematical expressions that the optimum position and the optimum capacitance value of the bulk capacitor which is the object of instant interest are simply and automatically computed, and if the actual design position and the actual capacitance value of the bulk capacitor of interest differ from the optimum position and the optimum capacitance value computed, the appropriate message instructing to modify these actual position and value to coincide with the optimum position and the optimum value is displayed. Thereby, even in a grand integrated circuit having a grand network including several hundreds of networks, it is enabled clearly to define a corresponding relationship of the bulk capacitor relative to the power pin (or ground pin) and the decoupling capacitors which are to be covered by each bulk capacitor in each loop, and ensure for the optimum capacitance value and the optimum position of each bulk capacitor to be determined.

Further, advantageously according to the invention, the bounce noise which is supposed to occur in the periphery of the power pin is substantially suppressed.

Still further, the radiation noise which occurs due to the bounce noise is suppressed substantially as well.

Although the present invention has been described in its preferred form with a certain degree of particularity, obviously many changes and variations are possible therein. It is therefore to be understood that the present invention may be practiced than as specifically described herein without departing from scope and the sprit thereof.

What is claimed is:

1. A printed circuit board wiring structure verification system comprising:

a unit for identifying a high speed IC incorporated in said board on the basis of a rise time of a signal of said high speed IC;

an optimum capacitance value computing unit for computing an optimum capacitance value for a bulk capacitor;

a comparison unit for comparing at least a capacitance value tentatively given to said bulk capacitance with said optimum capacitance value;

means for determining if there is a difference larger than a predetermined value between a tentative design value and an optimum value;

an optimum position computing unit for computing an optimum position for said bulk capacitor; and a means for determining if a proposed position of the bulk capacitor is separated by a distance larger than a predetermined value from the optimum position; and a means for identifying if the interconnect distance between said bulk capacitor and said high speed IC of the tentative design exceeds the predetermined value.

2. A printed circuit board wiring structure verification system comprising:
   a unit for identifying a high speed IC incorporated in said board on the basis of a rise time of a signal of said high speed IC;
   an optimum capacitance value computing unit for computing an optimum capacitance value for a bulk capacitor;
   a comparison unit for comparing at least a capacitance value tentatively given to said bulk capacitance with said optimum capacitance value,
   means for determining if there arises a difference larger than a predetermined value between a tentative design value and an optimum value;
   an optimum position computing unit for computing an optimum position for said bulk capacitor; and
   means for determining if a proposed position of the bulk capacitor is separated by a distance larger than a predetermined value from an optimum position, and further comprising:
      means for determining an optimum interconnect distance between said bulk capacitor and a decoupling capacitor; and
      means for identifying when said interconnect distance between the bulk capacitor and the decoupling capacitor exceeds a predetermined value.

3. A printed circuit board wiring structure verification system comprising:
   a unit for identifying a high speed IC incorporated in said board on the basis of a rise time of a signal of said high speed IC;
   an optimum capacitance value computing unit for computing an optimum capacitance value for a bulk capacitor;
   a comparison unit for comparing at least a capacitance value tentatively given to said bulk capacitance with said optimum capacitance value,
   determining if there arises a difference larger than a predetermined value between a tentative design value and an optimum value;
   an optimum position computing unit for computing an optimum position for said bulk capacitor; and
   means for determining if a proposed position of the bulk capacitor is separated by a distance larger than a predetermined value from an optimum position and further comprising:
      a unit for determining the number of bulk capacitors existing within a predetermined distance from each one of high speed ICs on the printed circuit board, and a total number of bulk capacitors;
      a comparison unit for comparing a total number of said bulk capacitors with the number of all the high speed ICs which is multiplied by a constant; and
      a means for identifying if the total number of bulk capacitors is smaller than the number of all the high speed ICs multiplied by the constant.

4. A printed circuit board wiring structure verification system comprising:
   a unit for identifying a high speed IC incorporated in said board on the basis of a rise time of a signal of said high speed IC;
   an optimum capacitance value computing unit for computing an optimum capacitance value for a bulk capacitor;
   a comparison unit for comparing at least a capacitance value tentatively given to said bulk capacitance with said optimum capacitance value,
   a means for determining if there arises a difference larger than a predetermined value between a tentative design value and an optimum value;
   an optimum position computing unit for computing an optimum position for said bulk capacitor; and
   a means for determining if a proposed position of the bulk capacitor is separated by a distance larger than a predetermined value from the optimum position,
   a means for determining an optimum interconnect distance between a power connector and the bulk capacitor; and
   a means for identifying if said optimum interconnect distance exceeds other predetermined value.

5. A printed circuit board wiring structure verification system comprising:
   a unit for identifying a high speed IC incorporated in said board on the basis of a rise time of a signal of said high speed IC;
   an optimum capacitance value computing unit for computing an optimum capacitance value for a bulk capacitor;
   a comparison unit for comparing at least a capacitance value tentatively given to said bulk capacitance with said optimum capacitance value,
   a means for determining if there arises a difference larger than a predetermined value between a tentative design value and an optimum value;
   an optimum position computing unit for computing an optimum position for said bulk capacitor; and
   a means for determining if a proposed position of the bulk capacitor is separated by a distance larger than a predetermined value from an optimum position;
   a means for determining an optimum interconnect distance between a daughter card connector and a bulk capacitor; and
   a means for identifying if said optimum interconnect distance exceeds other predetermined value.

6. A printed circuit board wiring structure verification system comprising:
   a unit for identifying a high speed IC incorporated in said board on the basis of a rise time of a signal of said high speed IC;
   an optimum capacitance value computing unit for computing an optimum capacitance value for a bulk capacitor;
   a comparison unit for comparing at least a capacitance value tentatively given to said bulk capacitance with said optimum capacitance value,
   a means for determining if there arises a difference larger than a predetermined value between a tentative design value and an optimum value;
   an optimum position computing unit for computing an optimum position for said bulk capacitor; and
   a means for determining if a proposed position of the bulk capacitor is separated by a distance larger than a predetermined value from an optimum position;
   determining an optimum interconnect distance between an input/output connector and said bulk capacitor; and a means for identifying if said optimum interconnect distance exceeds other predetermined value.

7. A printed circuit board wiring structure verification system comprising:

a unit for identifying a high speed IC incorporated in said board on the basis of a rise time of a signal of said high speed IC;

an optimum capacitance value computing unit for computing an optimum capacitance value for a bulk capacitor;

a comparison unit for comparing at least a capacitance value tentatively given to said bulk capacitance with said optimum capacitance value, a means for determining if there arises a difference larger than a predetermined value between a tentative design value and an optimum value;

an optimum position computing unit for computing an optimum position for said bulk capacitor;

a means for determining if a proposed position of the bulk capacitor is separated by a distance larger than a predetermined value from an optimum position; and wherein said wiring structure is either a micro strip line, a single strip line or a double strip line structures.

* * * * *